(12) United States Patent
Lee et al.

(10) Patent No.: US 7,829,373 B2
(45) Date of Patent: Nov. 9, 2010

(54) ORGANIC POLYMER SEMICONDUCTOR COMPOUNDS, METHODS OF FORMING ORGANIC POLYMER SEMICONDUCTOR THIN FILM USING THE SAME, AND ORGANIC THIN FILM TRANSISTORS USING THE SAME

(75) Inventors: Eun Kyung Lee, Seoul (KR); Joo Young Kim, Suwon-si (KR); Bang Lin Lee, Suwon-si (KR); Sang-Yoon Lee, Seoul (KR); Eun Jeong Jeong, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1013 days.

(21) Appl. No.: 11/270,472

(22) Filed: Nov. 10, 2005

(65) Prior Publication Data

US 2006/0255334 A1 Nov. 16, 2006

(30) Foreign Application Priority Data

May 11, 2005 (KR) .................... 10-2005-0039457

(51) Int. Cl.
*H01L 51/00* (2006.01)
*C08G 61/12* (2006.01)

(52) U.S. Cl. .......... 438/99; 257/E51.028; 257/E51.029; 525/24; 525/26

(58) Field of Classification Search .............. 438/82, 438/99; 257/E51.001–E51.052, 40; 525/24, 525/206–208, 348, 26
See application file for complete search history.

(56) References Cited

U.S. PATENT DOCUMENTS

| 5,254,633 | A | * | 10/1993 | Han et al. | ................. | 525/327.4 |
| 5,756,653 | A | | 5/1998 | Rieke | | |
| 5,962,192 | A | * | 10/1999 | Holman et al. | ............... | 430/302 |
| 6,107,117 | A | | 8/2000 | Bao et al. | | |
| 6,621,099 | B2 | * | 9/2003 | Ong et al. | ...................... | 257/40 |
| 2003/0166810 | A1 | * | 9/2003 | Holmes et al. | ............. | 526/256 |
| 2005/0159580 | A1 | * | 7/2005 | Liu et al. | .................... | 528/373 |
| 2007/0172978 | A1 | * | 7/2007 | Chua et al. | .................... | 438/99 |

OTHER PUBLICATIONS

Allard, Sybille et al, "Oligothiophenes for pattern formation by Stamping," Macromol. Chem. Phys. 2003, 204, p. 68-75.*
Lowe, J. and Holdcraft, S. "Synthesis and Photolithography of Polymers and Copolymers Based on Poly(3-(2-(methyacryloyloxy)ethyl)thiophene)." Macromol., vol. 28 (1995): pp. 4608-4616.*

(Continued)

*Primary Examiner*—Matthew W Such
(74) *Attorney, Agent, or Firm*—Harness, Dickey & Pierce, P.L.C.

(57) ABSTRACT

Disclosed herein is an organic polymer semiconductor compound, a method of forming an organic polymer semiconductor thin film using the same, and an organic thin film transistor using the same. Example embodiments of this invention pertain to an organic polymer semiconductor having a side chain including a removable substituent, and to an organic thin film transistor using the organic polymer semiconductor for an organic active layer, which has lower leakage current, higher charge mobility, and/or a higher on/off ratio.

9 Claims, 2 Drawing Sheets

OTHER PUBLICATIONS

Murray, K.A., et al. "Conformal Changes in Regioregular Polythiophenes Due to Thermal Crosslinking." J. Mater. Chem., vol. 9 (1999): pp. 2109-2115.*

David J. Brennan et al., "Polyfluorenes as Organic Semiconductors for Polymeric Field Effect Transistors," Mat. Res. Soc. Symp. Proc., vol. 771 pp. L6.1.1-L6.1.6, (2003).

Francis Garnier et al., "Molecular Engineering of Organic Semiconductors: Design of Self-Assembly Properties in Conjugated Thiophene Oligomers," J.Am. Chem. Soc. vol. 115, pp. 8716-8721 (1993).

Tommie W. Kelley et al., "High Performance Organic Thin Film Transistors," Mat. Res. Soc. Symp. Proc., vol. 771 pp. L6.5.1-L6.5.11, (2003).

Sandrine Martin et al., "Source/drain contacts in organic polymer thin film transistors," Mat. Res. Soc. Symp. Proc., vol. 771 pp. L6.2.1-L6.12.6, (2003).

Chinese Office Action dated Oct. 23, 2009 in corresponding Chinese Application No. 200610093726, and English translation.

* cited by examiner

ORGANIC POLYMER SEMICONDUCTOR COMPOUNDS, METHODS OF FORMING ORGANIC POLYMER SEMICONDUCTOR THIN FILM USING THE SAME, AND ORGANIC THIN FILM TRANSISTORS USING THE SAME

PRIORITY STATEMENT

This application claims priority under 35 U.S.C. §119 of Korean Patent Application No. 2005-39457, filed on May 11, 2005, in the Korean Intellectual Property Office (KIPO), the entire contents of which are incorporated herein by reference.

BACKGROUND OF THE INVENTION

1. Field of the Invention

Example embodiments of the present invention relate to novel organic polymer semiconductor compounds, methods of forming organic polymer semiconductor thin films using the same, and organic thin film transistors (OTFTs) using the same. Various example embodiments of the present invention relate to organic polymer semiconductor compounds having a side chain including (but not limited to), for example, a removable substituent, and/or an OTFT, using the organic polymer semiconductor compounds for an organic active layer.

2. Description of the Related Art

An OTFT may include a substrate, a gate electrode, an insulating layer, source/drain electrodes, and a channel layer. Such an OTFT may be classified into a bottom contact (BC) type OTFT, in which a channel layer may be formed on the source and drain electrodes, and a top contact (TC) type OTFT, in which a metal electrode may be formed on a channel layer.

The channel layer of the OTFT may be formed of an inorganic semiconductor material, for example, silicon (Si). However, according to recent trends toward larger display areas, lower prices and/or improved flexibility of displays, the above-noted channel layer may be made using an organic semiconductor material instead of an inorganic material requiring a conventional high temperature, vacuum manufacturing process.

In recent years, thorough research into an organic semiconductor material for a channel layer of an OTFT has been conducted, and transistor properties of these materials have been reported. Low molecular weight or oligomer type organic semiconductor materials, which have been studied, include, (but are not limited to), for example, melocyanine, phthalocyanine, perylene, pentacene, C60, thiophene oligomer, etc. In addition, a high charge mobility of 3.2-5.0 cm$^2$/Vs or more using pentacene monocrystals was reported. A charge mobility of 0.01-0.1 cm$^2$/Vs and on/off current ratio using an oligothiophene derivative were also reported.

However, the above-noted conventional techniques may be disadvantageous because they involve a process of forming a thin film mainly conducted in a vacuum. Such a process thus undesirably increases the manufacturing costs.

Conventional methods disclose synthesizing regioregular polythiophene P3HT (poly(3-alkylthiophene)) and an OTFT device having charge mobility of 0.01-0.04 cm$^2$/Vs manufactured using the regioregular polythiophene-P3HT. However, the regioregular polythiophene P3HT, having a charge mobility of about 0.01 cm$^2$/Vs, may be unstable in air and thus may have a high cut-off leakage current (10$^{-9}$ A or more), resulting in a lower on/off current ratio of 400 or less. Consequently, the above material may be unsuitable or undesirable for application in electronic devices. In addition, although conventional methods disclose an OTFT device using a polythiophene derivative having increased solubility, they may have at least some shortcomings, for example, a low charge mobility, despite having low leakage current.

SUMMARY

According to an example embodiment of the present invention, an organic polymer semiconductor material for OTFTs may be applied through spin casting at room temperature due to the higher solubility, and/or higher charge mobility and/or lower cut-off leakage current of the organic semiconductor material.

Various example embodiments of the present invention provide a method of forming an insoluble organic polymer semiconductor thin film, by applying one or more of the organic polymer semiconductor compound(s) through spin casting at room temperature, and then treating the applied organic polymer semiconductor compound(s) using heat or light (or radical reaction) to remove a substituent.

Another example embodiment of the present invention may provide an OTFT having a higher relative charge mobility and/or a lower relative leakage current and comprising the organic polymer semiconductor thin film.

According to yet another example embodiment of the present invention, organic polymer semiconductor compound(s) represented by Formula 1 below are provided:

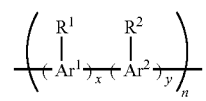

Formula 1 wherein Ar$^1$ and Ar$^2$ are independently an arylene group or a heteroarylene group having from about 3 to about 30 carbons, R$^1$ is independently hydrogen, a linear or branched alkyl group having from 1 to about 10 carbon atoms, a linear or branched hydroxyalkyl group having from 1 to about 10 carbon atoms, or a linear or branched alkoxyalkyl group having from 1 to about 10 carbon atoms, R$^2$ is an alkyl group, independently including an ester group (—OCO—), an ether group (—O—), a phosphate group (—OPO$_2$O—), —OCON—, an azide group (—N$_3$—), an amine group (—N$_2$—), a nitro group (—NO$_2$—), or a halogen group, as a substituent removable by heat, light or radical reaction, $0 \leq x <$ about 1 (e.g., $0 \leq x < 1$), and $0 < y \leq$ about 1 (e.g., $0 < y \leq 1$), and n is an integer ranging from about 10 to about 1,000 (e.g., 10, 100, 200, 300, 400, 500, 600, 700, 800, 900 or 1,000).

According to another example embodiment of the present invention, a method of forming an organic polymer semiconductor thin film is provided, comprising applying a solution of the organic polymer semiconductor compound(s) to form a coating film, and treating the coating film with heat or light (or radical reaction) to remove the removable substituent.

According to a further example embodiment of the present invention, an OTFT including an organic polymer semiconductor thin film as an organic active layer is provided.

BRIEF DESCRIPTION OF THE DRAWINGS

Example embodiments of the present invention will be more clearly understood from the following detailed descrip

FIG. 1 is a schematic sectional view showing an OTFT device, according to an example embodiment of the present invention;

FIG. 2 is an FT-IR spectrum of the organic thin film manufactured in accordance with the embodiment of Example 1; and FIG. 3 is a curve showing current transfer properties of the OTFT manufactured in accordance with the embodiment of Example 2.

DESCRIPTION OF EXAMPLE EMBODIMENTS OF THE PRESENT INVENTION

Figure 1:
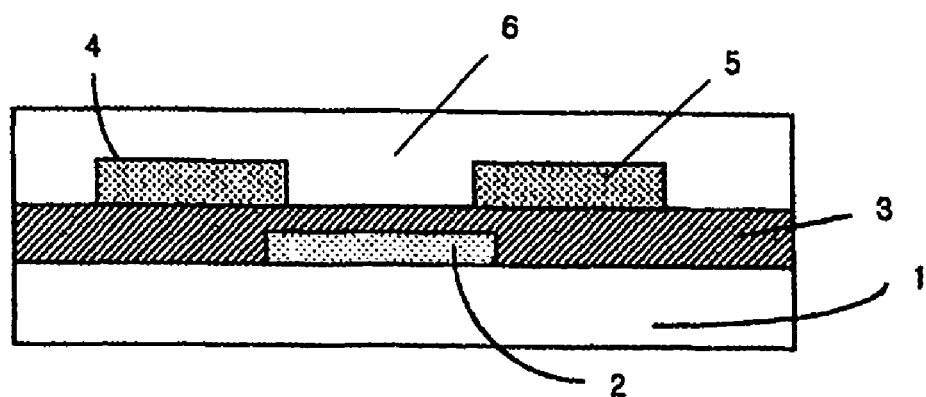
- FIGS. 1-3 represent non-limiting examples, embodiments and/or intermediates of the present invention as described herein.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, the use of the words "compound," "compounds," or "compound(s)," refer to either a single compound or to a plurality of compounds. These words are used to denote one or more compounds but may also just indicate a single compound.

According to an example embodiment of the present invention, organic polymer semiconductor compound(s) are represented by Formula 1 below:

Formula 1 wherein $Ar^1$ and $Ar^2$ are independently an arylene group or a heteroarylene group having from about 3 to about 30 atoms, $R^1$ is independently hydrogen, a linear or branched alkyl group having from 1 to about 10 carbon atoms, a linear or branched hydroxyalkyl group having from 1 to about 10 carbon atoms, or a linear or branched alkoxyalkyl group having from 1 to about 10 carbon atoms, $R^2$ is an alkyl group, independently including an ester group (—OCO—), an ether group (—O—), a phosphate group (—OPO$_2$O—), —OCON—, an azide group (—N$_3$—), an amine group (—N$_2$—), a nitro group (—NO$_2$—), or a halogen group, as a substituent removable by heat, light or radical reaction, $0 \leq x <$ about 1 (e.g., $0 \leq x < 1$) and $0 < y \leq$ about 1 (e.g., $0 < y \leq 1$), and n is an integer ranging from about 10 to about 1,000.

Specific non-limiting examples of $Ar^1$ and $Ar^2$ which are independently selected from among arylenes and heteroarylenes are represented by Formula 2 below, including, but not limited to, thiophene, thiazine, or quinoxaline:

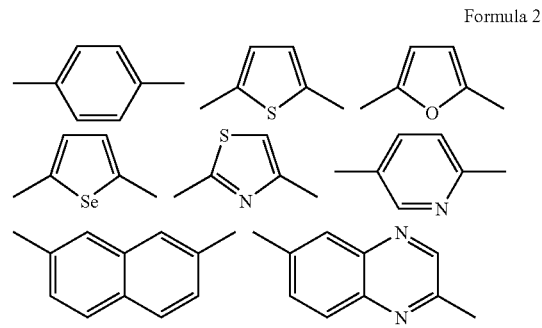

Formula 2

-continued

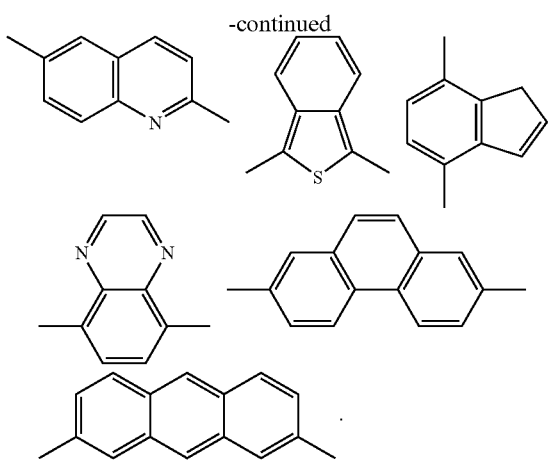

According to an example embodiment of the present invention, the organic polymer semiconductor compound(s) have an attached alkyl group, including an ester group (—OCO—), an ether group (—O—), a phosphate group (—OPO$_2$O—), —OCON—, an azide group (—N$_3$—), an amine group (—N$_2$—), a nitro group (—NO$_2$—), or a halogen group, as the substituent removable by heat or light (or radical reaction), at the side chain thereof. According to an example embodiment, the organic polymer semiconductor compound(s) may be applied at room temperature through known coating processes, and then the removable substituent thereof may be removed by heat or light (or radical reaction). Without being bound by theory, the removable substituent imparts an appropriate orientation and/or solubility to the semiconductor compound(s). By removing the removable substituent, the organic polymer semiconductor compound(s) may be converted to an insoluble organic polymer semiconductor thin film. When such a thin film is applied to an OTFT, the charge mobility may be increased and/or the leakage current may be somewhat decreased.

For example, among the organic polymer semiconductor compounds represented by Formula 1, a compound including an ester group at a side chain thereof may be represented by Formulas 3 or 4 below:

Formula 3

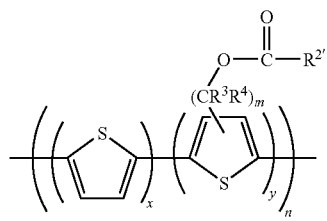

Formula 4

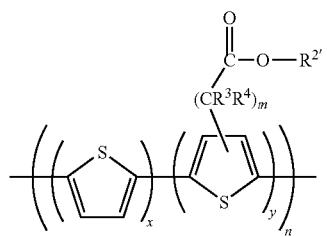

wherein in Formulas 3 and 4, $R^{2'}$ is independently a linear or branched alkyl group having from 1 to about 30 carbon atoms, an alkoxyalkyl group having from 1 to about 30 carbon atoms, an alkyl group (e.g., including a siloxy group) having from 1 to about 30 carbon atoms, or a perfluoroalkyl group having from 1 to about 30 carbon atoms, wherein $R^3$ and $R^4$ are independently a hydrogen, a linear or branched alkyl group having from 1 to about 12 carbon atoms, or an alkoxyalkyl group having from 1 to about 12 carbon atoms, $0 \leq x <$ about 1 (or e.g., $0 \leq x < 1$), and $0 < y \leq$ about 1 (or e.g., $0 < y \leq 1$), and n is an integer ranging from about 10 to about 1,000.

Specific examples of a polythiophene derivative including a removable ester group as a side chain thereof include (but are not limited to) polymer compounds represented by Formulas 5 to 11 below:

Formula 5

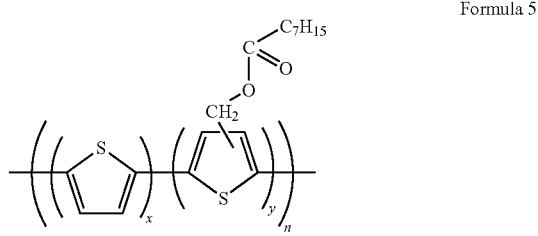

Formula 6

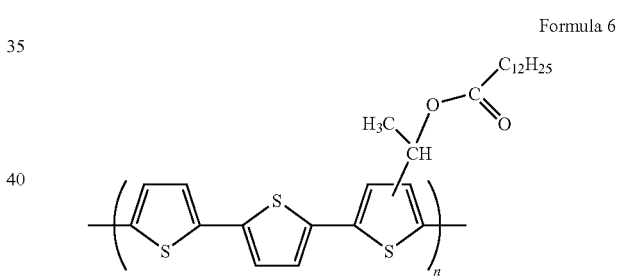

Formula 7

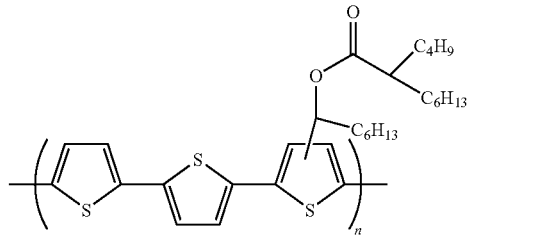

Formula 8

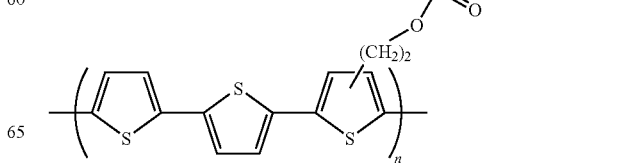

-continued

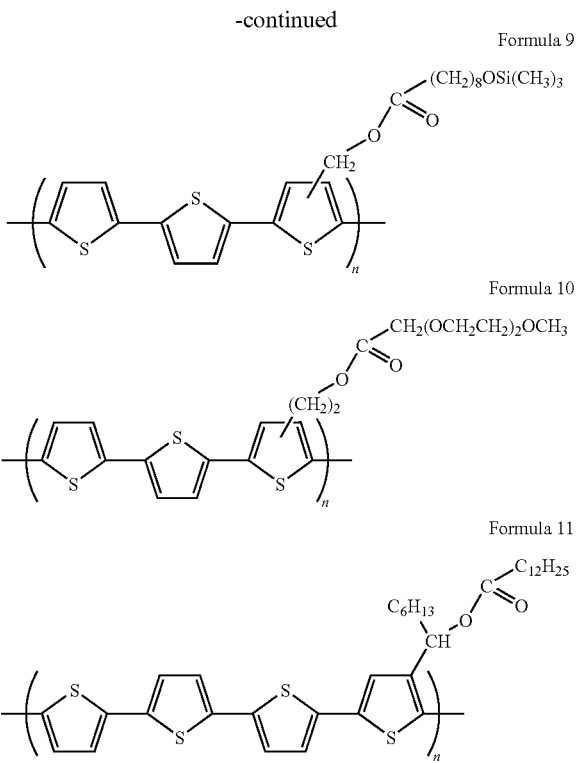

Formula 9

Formula 10

Formula 11 wherein in Formulas 5 to 11, $0 \leq x <$ about 1 (or e.g., $0 \leq x < 1$), and $0 < y \leq$ about 1 (e.g., $0 < y \leq 1$), and n is an integer ranging from about 10 to about 1,000.

Other example embodiments of the present invention include, but are not limited to, the organic polymer semiconductor compounds represented by Formulas 12 or 13 below:

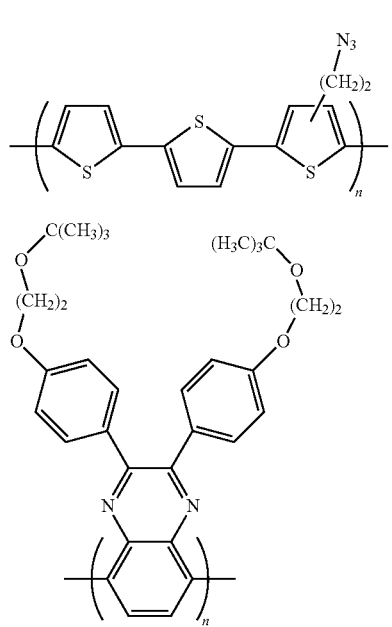

Formula 12

Formula 13 wherein in Formulas 12 or 13, n is an integer ranging from about 10 to about 1,000 (or e.g., 10 to 1,000).

The organic polymer semiconductor compound(s) used in example embodiments of the present invention has/have a number average molecular weight ranging from about 3,000 to about 70,000 (e.g., 3,000 to 70,000; 4,000; 5,000; 10,000; 20,000; 30,000; 40,000; 50,000; or 60,000), and a weight average molecular weight ranging from about 5,000 to about 150,000 (e.g., 6,000; 10,000; 20,000; 30,000; 40,000; 50,000; 60,000; 70,000; 80,000; 90,000; 100,000; 110,000; 120,000; 130,000; or 140,000).

An example of the organic polymer semiconductor compound in accordance with an embodiment of the present invention is a polythiophene derivative. The example embodiment of the polythiophene derivative of the present invention may be synthesized according to typical methods, which are not particularly limited by the methods specifically disclosed herein. The polythiophene derivatives represented by Formulas 5 to 11 may be synthesized by a variety of methods (including, but not limited to, methods) as follows. For example, the polythiophene derivative may be synthesized by polymerizing a monomer obtained through Reaction 1 below and another monomer obtained through Reaction 2 below in the presence of a palladium catalyst, according to Reaction 3 below:

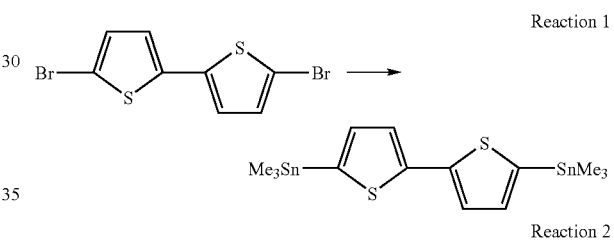

Reaction 1

Reaction 2

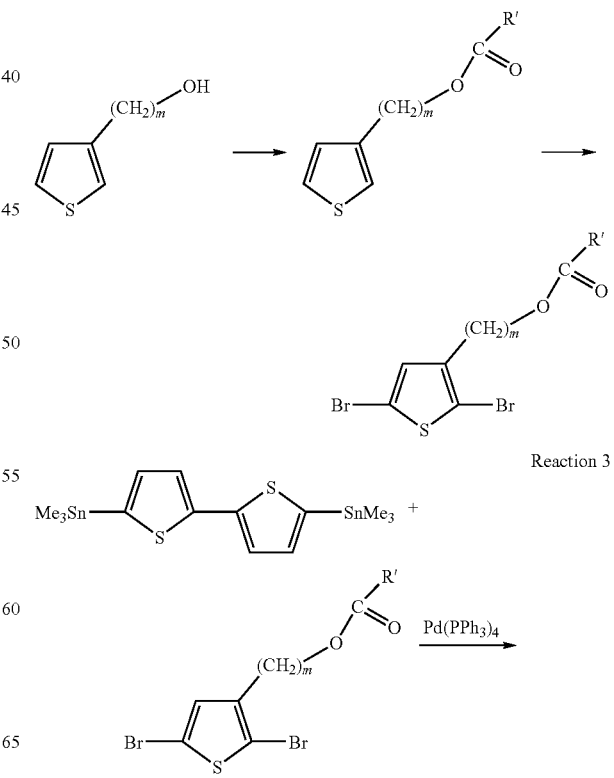

Reaction 3

-continued

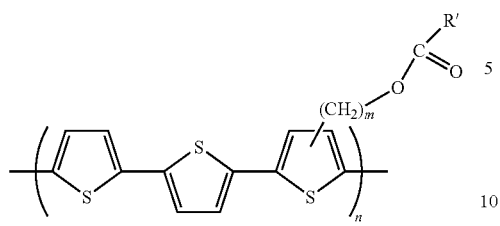

wherein in Reactions 1 to 3, R' is independently a linear or branched alkyl group having from 1 to about 30 carbon atoms, an alkoxyalkyl group having from 1 to about 30 carbon atoms, an alkyl group (including a siloxy group) having from 1 to about 30 carbon atoms, or a perfluoroalkyl group having from 1 to about 30 carbon atoms, and wherein n is an integer ranging from about 10 to about 1,000.

In addition, example embodiments of the organic polymer semiconductor compound represented by Formulas 12 or 13 may be prepared by reacting the monomer obtained through Reaction 1 with an appropriate side chain compound according to, for example, Reactions 4 or 5 below:

Reaction 4

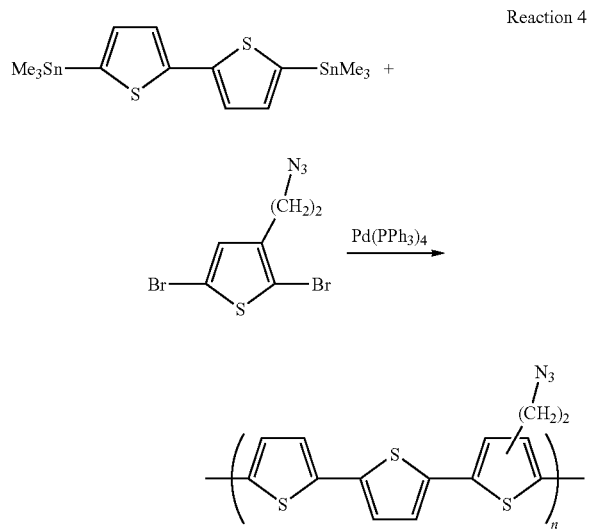

Reaction 5

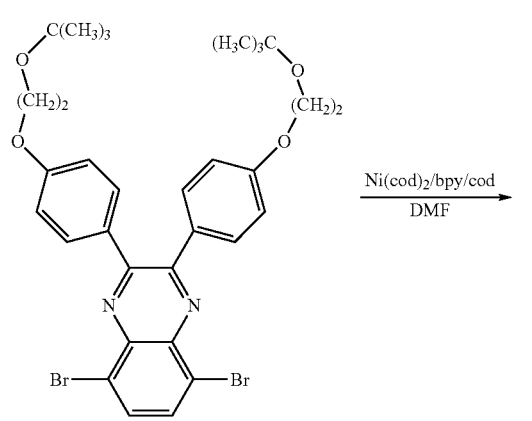

-continued

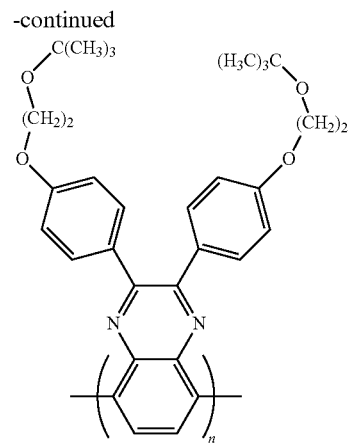

wherein in Reaction 4 or 5, n is an integer ranging from about 10 to about 1,000.

In addition, the monomers obtained through, for example, Reactions 1 and 2 may undergo a condensation reaction known as Stille coupling, and thus, may be synthesized into the polythiophene derivative represented by the example embodiment Formula 1 of the present invention. The above reaction may be conducted at a temperature from about 50 to about 130° C. (e.g., 50° C., 60° C., 70° C., 80° C., 90° C., 100° C., 110° C., 120° C., or 130° C.) for a time from about 2 to about 24 hr (e.g., 2 h, 3 h, 4 h, 5 h, 10 h, 15 h, 20 h, or 24 h) in a nitrogen atmosphere (or other suitable atmosphere), using a suitable solvent, for example, toluene, N-methylpyrrolidinone, tetrahydrofuran, dimethylformamide, etc. Other suitable solvents may be used.

Further, the palladium catalyst which may be used to synthesize the polythiophene derivative example embodiment of the present invention may be represented by Formulas 14 to 16 below:

$PdL_4$           Formula 14

$PdL_2X_2$           Formula 15

$PdL_2$           Formula 16 wherein in Formulas 14 to 16, L may be a ligand selected from the group consisting of triphenylphosphine ($PPh_3$), triphenylarsine ($AsPh_3$), triphenylphosphite $P(OPh)_3$, diphenylphosphinoferrocene (dppf), diphenylphosphinobutane (dppb), acetate (OAc), and dibenzylidoneacetone (dba), and X may be at least one of I, Br or Cl. Other suitable catalysts may be used.

In addition, an organic polymer semiconductor compound (according to an example embodiment of the present invention) may be applied at room temperature through known coating processes, to form a coating film, which may then be treated using heat or light (or radical reaction) to remove the removable substituent therefrom, thereby forming an insoluble organic polymer semiconductor thin film, as shown, for example, in Reaction 6 below:

Reaction 6

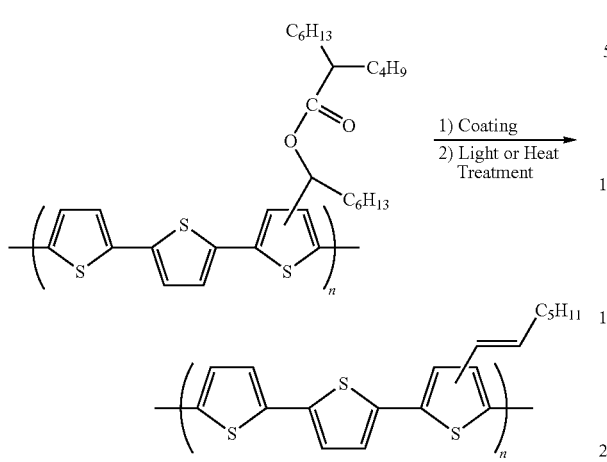

The coating process for use in the formation of the thin film includes (but is not limited to), for example, screen printing, printing, spin casting, dipping, or ink-jetting.

Further, the treatment conditions of heat or light (or radical reaction) may vary with the thermal properties of the organic polymer semiconductor compounds used. The heat treatment may be conducted at a temperature from about 150 to about 300° C. (e.g., 150° C., 160° C., 170° C., 180° C., 190° C., 200° C., 250° C., 275° C., or 300° C.) and the light treatment may be conducted by radiating ultraviolet light (UV) having a wavelength from about 250 nm to about 350 nm (e.g., 250 nm, 275 nm, 300 nm, 325 nm or 350 nm) in a dose from about 500 to about 1000 mJ/cm$^2$.

An example organic polymer semiconductor compound according to an embodiment of the present invention may be used, and may be applied to an active layer of an OTFT device as shown in the example embodiment of FIG. 1.

An OTFT device according to an example embodiment of the present invention may be sequentially formed into a TC structure (not shown) comprising substrate/gate electrode/gate insulating layer/organic active layer/source-drain electrodes. Another OTFT device according to another example embodiment of the present invention may also be sequentially formed into a BC structure comprising substrate 1/gate electrode 2/gate insulating layer 3/source drain electrodes 4 and 5/organic active layer 6, as seen in the example embodiment of FIG. 1.

According to an example embodiment of the present invention, substrate 1 may be formed of glass, polyethylenenaphthalate (PEN), polyethyleneterephthalate (PET), polycarbonate, polyvinylalcohol, polyacrylate, polyimide, polynorbonene, polyethersulfone (PES), etc., but is not limited thereto. Other suitable substrate metals/materials may be used.

According to another example embodiment of the present invention, gate electrode 2 may be formed of a typically used metal, and specifically includes, for example, gold (Au), silver (Ag), aluminum (Al), nickel (Ni), chromium (Cr), indium tin oxide (ITO), etc., but is not limited thereto. Other suitable gate electrode metals/materials may be used.

According to yet another example embodiment of the present invention, the gate insulting layer 3 included in an OTFT device may be formed of an insulator having (as an example) a higher dielectric constant, and specifically may include, for example, a ferroelectric insulator selected from the group consisting of $Ba_{0.33}Sr_{0.66}TiO_3$ (BST), $Al_2O_3$, $Ta_2O_5$, $La_2O_5$, $Y_2O_3$ and $TiO_2$; an inorganic insulator selected from the group consisting of $PbZr_{0.33}Ti_{0.66}O_3$(PZT), $Bi_4Ti_3O_{12}$, $BaMgF_4$, $SrBi_2(TaNb)_2O_9$, $Ba(ZrTi)O_3$(BZT), $BaTiO_3$, $SrTiO_3$, $Bi_4Ti_3O_{12}$, $SiO_2$, $SiN_x$ and AlON; or an organic insulator selected from the group consisting of polyimide, benzocyclobutene (BCB), parylene, polyacrylate, polyvinylalcohol and polyvinylphenol, but is not limited thereto, respectively. Other suitable ferroelectric insulators, inorganic insulators or organic insulators may be used.

According to still another example embodiment of the present invention, the source and drain electrodes 4 and 5 may be formed of a metal (as an example), and specifically may include, for example, gold (Au), silver (Ag), aluminum (Al), nickel (Ni), indium tin oxide (ITO), etc., but are not limited thereto. Other suitable metals/materials for the source and/or drain electrodes may be used.

Various example embodiments of the present invention are set forth to illustrate, but are not to be construed to limit, the scope of the present invention.

It will be understood that the following are non-limiting examples of various embodiments of the present invention.

EXAMPLES

Preparative Example 1

Synthesis of Monomer A

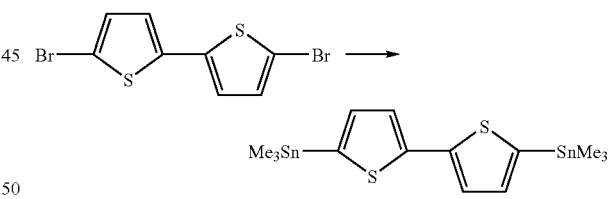

2,2'-dibromodithiophene (13.3 g, 41.0 mmol) was loaded into a two-neck round flask, dissolved in 1 L of tetrahydrofuran (THF), and then slowly added with n-butyllithium (n-BuLi, 36.0 ml, 90.0 mmol) at −78° C. The reaction mixture was stirred at the same temperature for about 1 hr, slowly added with trimethyltinchloride (Me$_3$SnCl, 90.0 ml, 90.0 mmol), and then further stirred for 3 hr. The reaction mixture was added with H$_2$O (300 ml) to complete the reaction, and then extracted 2-3 times with ether, to obtain an organic layer, which was then washed with brine (aqueous NaCl solution), dried over anhydrous magnesium sulfate, filtered, and concentrated, obtaining a white solid product (11.5 g, yield=55%).

$^1$H-NMR (300 MHz, CDCl$_3$) d (ppm) 0.38 (s, 18H), 7.08 (d, 2H), 7.27 (d, 2H).

Preparative Example 2

Synthesis of Monomer B

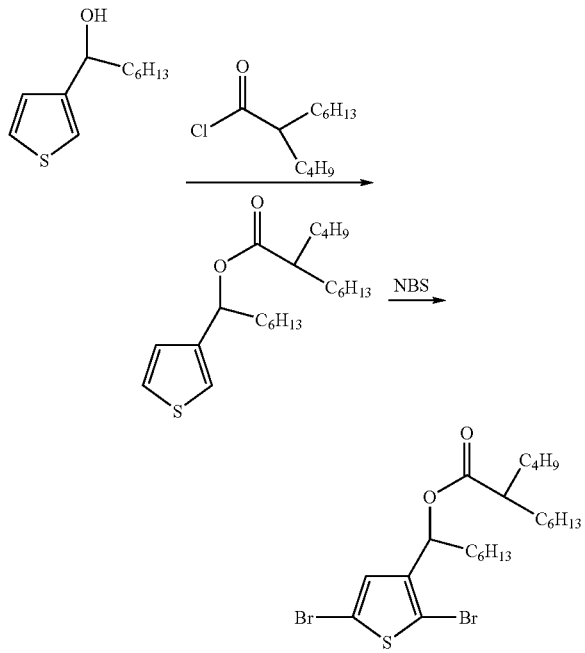

Into a round flask, 3-thiopheneheptanol (1.0 g, 5.04 mmol), pyridine (0.65 ml), and dimethylaminopyridine (DMAP, 4.8 mg) were loaded and then dissolved in 35 ml of THF, after which the reaction temperature was decreased to 0° C. Subsequently, lauroylchloride (1.1 g, 5.04 mmol) was added, and thereafter, the reaction mixture was stirred at room temperature for ten minutes. The stirred reaction solution was diluted with excess ethylacetate to complete the reaction, and then filtered. The obtained organic solution was washed with 0.1 M aqueous hydrochloride solution, 10% ammonia water and then brine, and dried over anhydrous magnesium sulfate (MgSO$_4$), obtaining a white crystalline solid (1.5 g, yield=62%) as an intermediate of a monomer B through a silica gel column using a solvent mixture of hexane/ethylacetate.

$^1$H-NMR (300 MHz, CDCl$_3$) d (ppm) 0.86 (t, 3H), 1.26 (m, 28H), 1.54 (m, 2H), 2.31 (t, 1H), 2.36 (t, 1H), 2.75 (t, 1H), 5.88 (t, 1H), 7.04 (dd, 1H), 7.20 (dd, 1H), 7.26 (dd, 1H).

The solution of intermediate (1.5 g, 3.94 mmol) thus obtained in DMF (40-50 ml) was slowly added to (or mixed with) 1.47 g (8.27 mmol) of N-bromosuccinimide (NBS) at room temperature. While the reaction solution was stirred, the reaction temperature was gradually increased to 60° C., at which stirring was additionally conducted for 2 hr. The reaction temperature was decreased to room temperature, and the reaction solution was diluted with ethylacetate, and then filtered, to obtain an organic solution, which was then washed with dilute sodium bicarbonate, water, and brine, in that order, dried over anhydrous magnesium sulfate (MgSO$_4$), and thereafter filtered. Through a silica gel column using a solvent mixture of hexane/ethylacetate, a monomer B was obtained (1.5 g, yield=66%).

$^1$H-NMR (300 MHz, CDCl$_3$) d (ppm) 0.87 (t, 3H), 1.23 (m, 27H), 1.55 (m, 2H), 1.57 (m, 2H), 1.83 (m, 1H), 2.32 (m, 1H), 5.76 (t, 1H), 6.86 (s, 1H).

Preparative Example 3

Synthesis of Monomer C

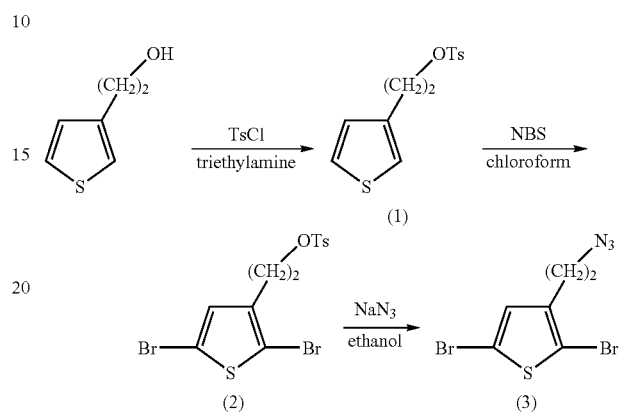

In a round flask, 2-(3-tienyl)ethanol (1.0 g, 7.8 mmol) and triethylamine (0.95 g, 9.4 mmol) were dissolved in 35 ml of THF, after which the reaction temperature was decreased to 0° C. Subsequently, the reaction solution was added to (or mixed with) p-toluenesulfonylchloride (TsCl, 1.79 g, 9.4 mmol), stirred at room temperature for ten minutes, diluted with excess ethylacetate to complete the reaction, and then filtered. The obtained organic solution was washed with 0.1 M aqueous hydrochloride solution, 10% ammonia water and brine, and then dried over anhydrous magnesium sulfate (MgSO$_4$), obtaining a white crystalline solid (1.5 g, yield=75%) as an intermediate 1 of a monomer C through a silica gel column using a solvent mixture of hexane/ethylacetate.

The solution of intermediate 1 (1.5 g, 5.3 mmol) thus obtained in DMF (40-50 ml) was slowly added to (or mixed with) 1.89 g (10.62 mmol) of NBS at room temperature. While the reaction solution was stirred, the reaction temperature was gradually increased to 60° C., at which stirring was additionally conducted for 2 hr. The reaction temperature was decreased to room temperature, and the reaction solution was diluted with ethylacetate, and then filtered, to obtain an organic solution, which was then washed with dilute sodium bicarbonate, water, and brine, in that order, dried over anhydrous magnesium sulfate (MgSO$_4$), and thereafter filtered. Through a silica gel column using a solvent mixture of hexane/ethylacetate, an intermediate 2 of a monomer C was obtained (1.6 g, yield=69%).

The solution of intermediate 2 (1.6 g, 3.65 mmol) thus obtained in ethanol (40-50 ml) was slowly added to (or mixed with) 0.28 g (4.38 mmol) of sodium azide (NaN$_3$) at room temperature, and then stirred for 2 hr. The reaction temperature was diluted with ethylacetate, and then filtered, to obtain an organic solution, which was then washed with dilute sodium bicarbonate, water, and brine, in that order, dried over anhydrous magnesium sulfate (MgSO$_4$), and filtered. Through a silica gel column using a solvent mixture of hexane/ethylacetate, an intermediate 3 of a monomer C was obtained (0.8 g, yield=70%).

$^1$H-NMR (300 MHz, CDCl$_3$) d (ppm) 1.7 (t, 2H), 2.6 (t, 2H), 6.41 (s, 1H)

Preparative Example 4

Synthesis of Monomer D

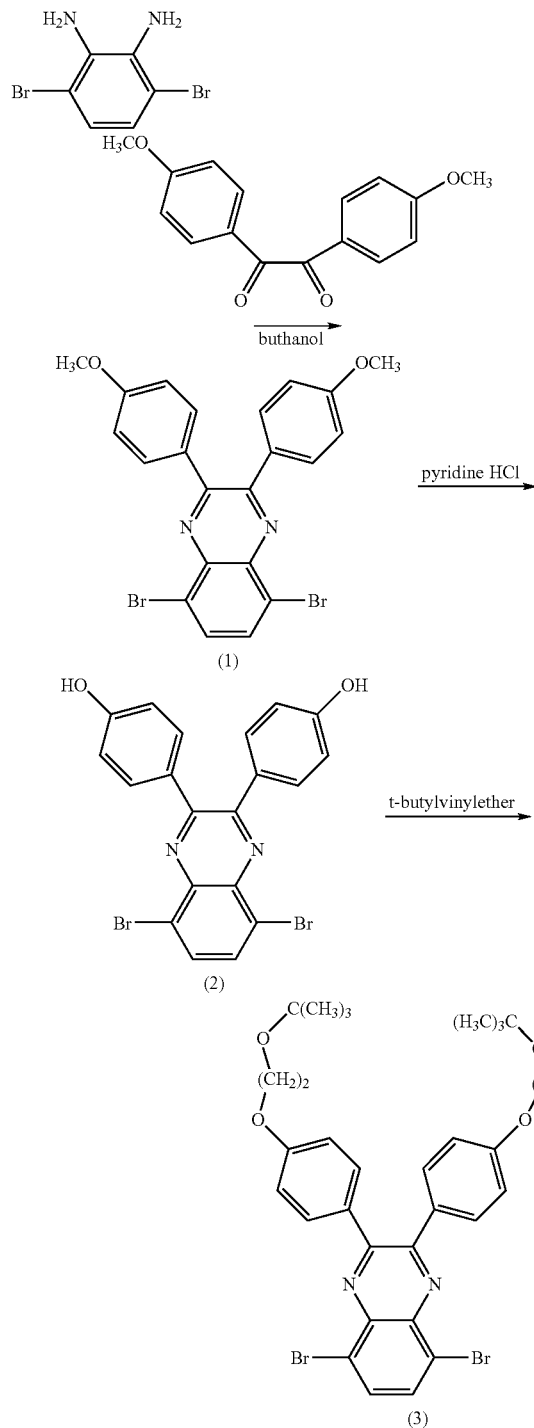

In a round flask, 3,6-dibromobenzene-1,2-diamine (4.0 g, 15.04 mmol) and 1,2-bis-(4-methoxyphenyl)-ethane-1,2-dione (4.88 g, 18.05 mmol) were dissolved in 50 ml of butanol, after which acetic acid was added in 2-3 droplets (10 μl) to the reaction solution. The resultant solution was refluxed at 120° C. for 4-5 hr. The refluxed solution was cooled to 0° C., filtered, washed with hot ethanol, and then dried, obtaining an intermediate 1 of a monomer D as a yellowish solid (4.8 g, yield=64%).

The above intermediate 1 (4.8 g, 9.6 mmol) was added to (or mixed with) 10 g of pyridine hydrochloride, and then refluxed at 200° C. for 7-8 hr. The reaction solution was cooled to room temperature, diluted with diethylether, and filtered to obtain an organic solution, which was then washed with dilute hydrochloride solution, water and brine, in that order, dried over anhydrous magnesium sulfate (MgSO$_4$), and filtered, obtaining an intermediate 2 of a monomer D as a yellowish solid (3.8 g, yield=88%).

The solution of the above intermediate 2 (2.0 g, 4.24 mmol) in TFT (40-50 ml) was added to (or mixed with) t-butylvinylether (1.06 g, 10.6 mmol) and then slowly added with a small amount of p-toluenesulfonic acid (100 mg) at room temperature, followed by stirring for 2 hr. The reaction solution was diluted with ethylacetate, and then filtered, to obtain an organic solution, which was thereafter washed with dilute sodium bicarbonate, water and brine, in that order, dried over anhydrous magnesium sulfate (MgSO$_4$), and then filtered. Through a silica gel column using a solvent mixture of hexane/ethylacetate, an intermediate 3 of a monomer D was obtained (2.0 g, yield=74%).

$^1$H-NMR (300 MHz, CDCl$_3$) d (ppm) 1.21 (t, 18H), 3.79 (t, 4H), 4.11 (t, 4H), 6.88 (d, 4H), 7.65 (d, 4H), 7.85 (d, 2H).

Synthetic Example 1

Synthesis of Polythiophene Derivative A

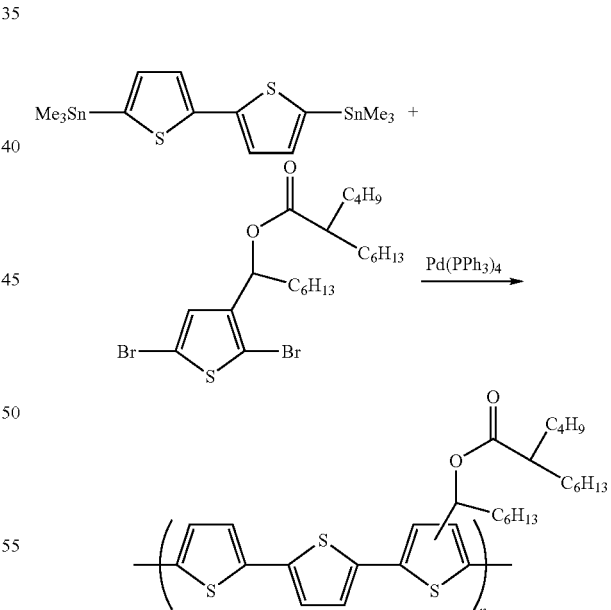

The monomer A (0.6 g, 1.22 mmol) prepared in Preparative Example 1 and the monomer B (0.66 g, 1.22 mmol) prepared in Preparative Example 2 were loaded into a reaction vessel under a nitrogen atmosphere, and completely dissolved in anhydrous DMF while being weakly heated (85° C.). As a polymerization catalyst, 10 mol % palladium (0) compound Pd(PPh$_3$)$_4$ (0.1 eq) was used. The reaction solution was allowed to react at 80-90° C. for 12 hr in a nitrogen atmosphere while being stirred, and was then cooled to room temperature. Subsequently, the reaction solution at room temperature was filtered, added to a mixture of aqueous dilute hydrochloride solution/chloroform (1/1, ca. 500 ml), stirred for 12 hr, and then filtered under reduced pressure (1 torr). This procedure was repeated twice, and the resultant solution was washed several times with a mixture of ammonia water/chloroform (1/1, ca. 2.0 L) and a mixture of distilled water/chloroform (1/1, ca. 2.0 L), after which the chloroform layer was concentrated, to obtain a solid. The solid was washed with an organic solvent such as methanol or acetone, filtered, and dried, thus obtaining a polythiophene derivative A (0.28 g) having a number average molecular weight of 19,000 at a yield of 41%, in which n was about 34.

$^1$H-NMR (300 MHz, CDCl$_3$) d (ppm) 0.87 (t, 3H), 1.27 (broad, 28H), 1.62 (b, 2H), 1.80 (t, 1H). 1.95 (t, 1H), 2.40 (b, 1H), 6.10 (b, 1H), 7.14 (b, Thiophene-4H).

Synthetic Example 2

Synthesis of Polythiophene Derivative B

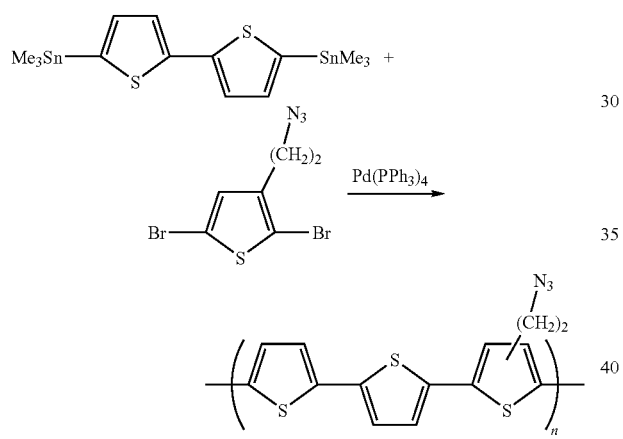

The monomer A (0.6 g, 1.22 mmol) prepared in Preparative Example 1 and the monomer C (0.37 g, 1.22 mmol) prepared in Preparative Example 3 were loaded into a reaction vessel under a nitrogen atmosphere, and completely dissolved in anhydrous DMF while being weakly heated (85° C.). As a polymerization catalyst, 10 mol % palladium (0) compound Pd(PPh$_3$)$_4$ (0.1 eq) was used. The reaction solution was allowed to react at 80-90° C. for 12 hr in a nitrogen atmosphere while being stirred, and was then cooled to room temperature. Subsequently, the reaction solution at room temperature was filtered, added to a mixture of aqueous dilute hydrochloride solution/chloroform (1/1, ca. 500 ml), stirred for 12 hr, and then filtered under reduced pressure (1 torr). This procedure was repeated twice, and the resultant solution was washed several times with a mixture of ammonia water/chloroform (1/1, ca 2.0 L) and a mixture of distilled water/chloroform (1/1, ca. 2.0 L), after which the chloroform layer was concentrated to obtain a solid. The solid was washed with an organic solvent such as methanol or acetone, filtered, and dried, thus obtaining a polythiophene derivative B (0.15 g) having a number average molecular weight of 18,000 at a yield of 38%, in which n was about 56.

$^1$H-NMR (300 MHz, CDCl$_3$) d (ppm) 1.7 (t, 2H), 2.6 (t, 2H), 6.41 (s, 1H) 7.14 (b, Thiophene-4H).

Synthetic Example 3

Synthesis of Polyquinoxaline Derivative C

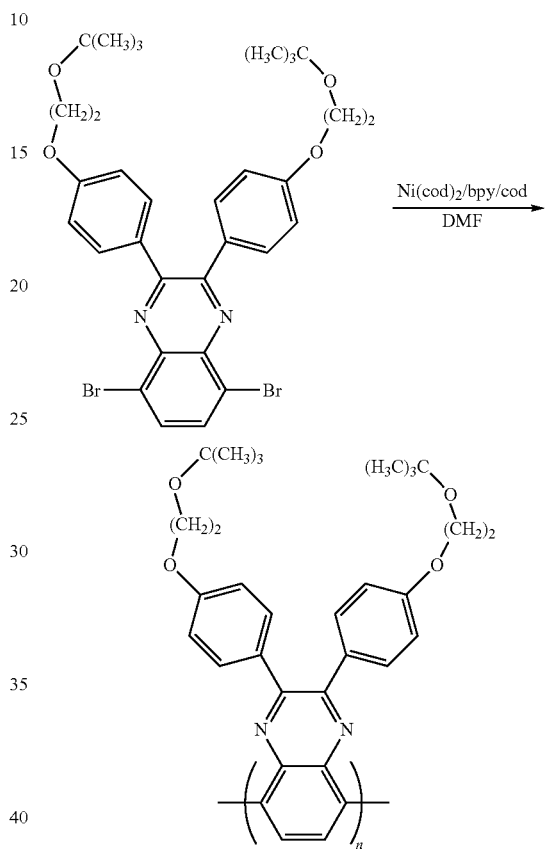

In a flask, Ni(cod)$_2$ (0.67 g, 2.44 mmol) serving as a nickel (0) polymerization catalyst was added to 20 ml of DMF in a nitrogen atmosphere. Subsequently, bipyridine (0.38 g, 2.44 mmol) and cyclohexadiene (0.263 g, 2.44 mmol) were added to the reaction solution, after which the monomer D (0.82 g, 1.22 mmol) prepared in Preparative Example 4 was loaded into the reaction vessel under a nitrogen atmosphere. The reaction solution was allowed to react at 80-90° C. for 12 hr in a nitrogen atmosphere while being stirred, and was then cooled to room temperature. Subsequently, the reaction solution at room temperature was filtered, added to a mixture of aqueous dilute hydrochloride solution/chloroform (1/1, ca. 500 ml), stirred for 12 hr, and then filtered under reduced pressure (1 torr). This procedure was repeated twice, and the resultant solution was washed several times with a mixture of ammonia water/chloroform (1/1, ca. 2.0 L) and a mixture of distilled water/chloroform (1/1, ca. 2.0 L), after which the chloroform layer was concentrated to obtain a solid. The solid was washed with an organic solvent such as methanol or acetone, filtered, and dried, thus obtaining a polyquinoxaline derivative C (0.4 g) having a number average molecular weight of 21,000 at a yield of 49%, in which n was about 31.

¹H-NMR (300 MHz, CDCl₃) d (ppm) 1.21 (t, 18H), 3.79 (t, 4H), 4.11 (t, 4H), 6.88 (d, 4H), 7.65 (m, 4H), 7.85 (m, 2H).

Example 1

Formation of Organic Thin Film Using Polythiophene Derivative

Figure 2:
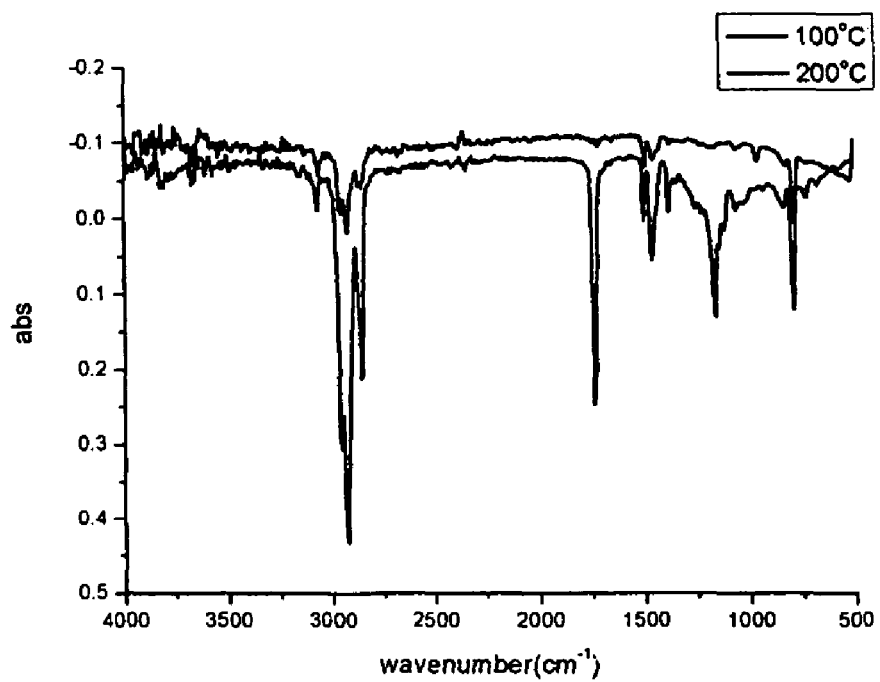

The polythiophene derivative synthesized in Synthetic Example 1 was dissolved in toluene at a concentration of 1.0 wt %, applied to a glass substrate at a thickness of 700 Å by spin casting at 1,000 rpm, and then baked at 100° C. for 1 hr in an argon atmosphere. To remove the ester substituent heat-removable, heat treatment was performed at 200° C. for 1 hr. To observe the structural differences in the organic polymer semiconductor before and after the heat treatment, FT-IR was measured. The results are shown in FIG. 2. From FIG. 2, it was confirmed tat the peak of an ester group was not observed in the range from 1,720 to 1,740 cm⁻¹, after the heat treatment.

Example 2

Manufacture of OTFT Using Polythiophene Derivative A

Figure 3:
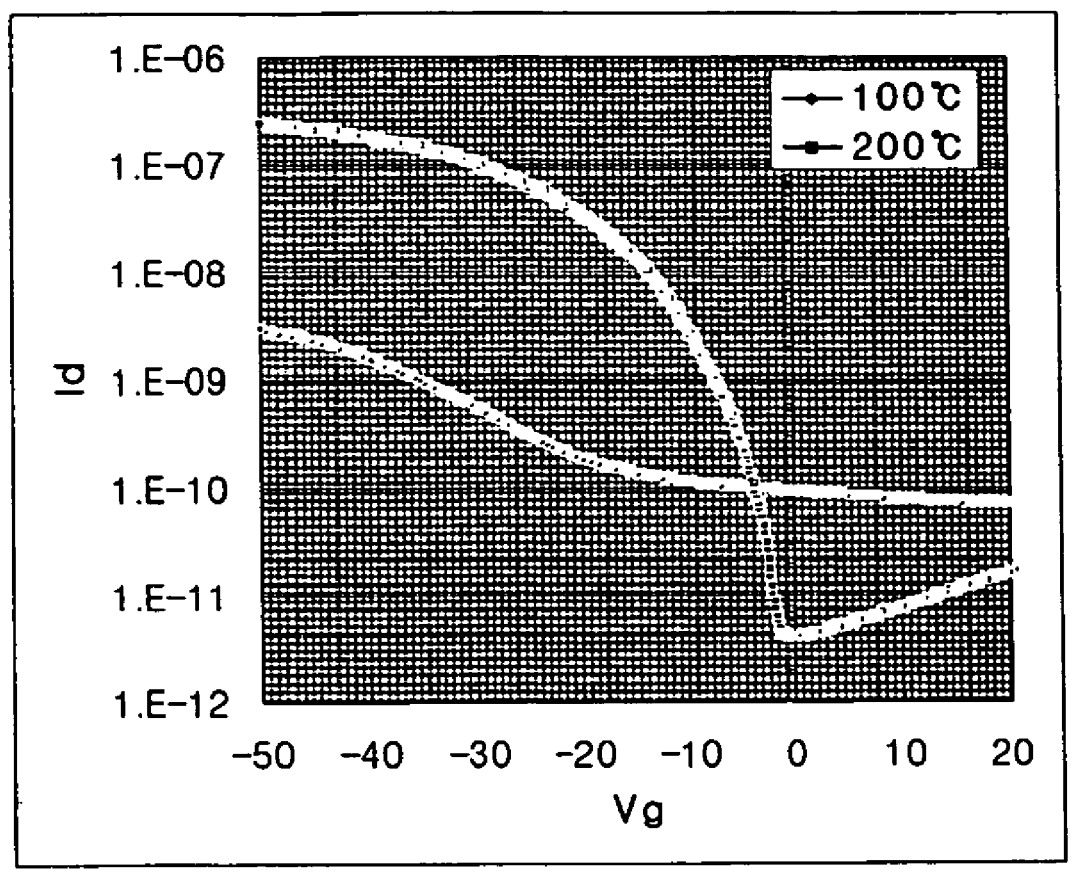

On a previously washed plastic substrate, chromium serving as a gate electrode was deposited to a thickness of 1000 Å through sputtering, after which SiO₂ serving as a gate insulating film was deposited to a thickness of 1000 Å through chemical vapor deposition (CVD). Subsequently, ITO, serving as source-drain electrodes, was deposited on the gate insulating film to a thickness of 1200 Å through sputtering. The substrate was washed with isopropyl alcohol for 10 min and then dried, before an organic semiconductor material was deposited thereon. A sample thus manufactured was dipped into 10 mM octadecyltrichlorosilane solution in hexane for 30 sec, washed with acetone, dried, coated with the 1.0 wt % polythiophene derivative A synthesized in Synthetic Example 1 in toluene to a thickness of 700 Å at 1,000 rpm, and then baked at 100° C. for 1 hr in an argon atmosphere, to manufacture the BC type OTFT device shown in the example embodiment of FIG. 1. The charge mobility of the device was measured. The current transfer properties were measured using a semiconductor characterization system (4200-SCS) available from KENILEY Co. Ltd., and the current transfer curve is shown in FIG. 3. The measured properties of the device are given in Table 1 below.

The charge mobility was calculated using the above current transfer curve and the following current equation for the saturation region.

That is, the current equation for the saturation region was converted to a graph relating $(I_{SD})^{1/2}$ and $V_G$, and the charge mobility was calculated from the slope of the converted graph:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

wherein $I_{SD}^{1/2}$ is source-drain current; $\mu$ or $\mu_{FET}$ is charge mobility; $C_O$ is oxide film capacitance; W is channel width; L is channel length; $V_G$ is gate voltage; and $V_T$ is threshold voltage.

The cut-off leakage current ($I_{off}$), which is the current flowing in the off-state, was determined to be the minimum current in the off-state.

To observe the changes in properties of the device after the heat treatment of the organic polymer semiconductor, the polythiophene derivative was baked at 100° C. for 1 hr and then heat treated at 200° C. for 1 hr, after which the charge mobility of the device was measured. The current transfer curve is shown in FIG. 3, and the measured properties of the device (of this example embodiment) are given in Table 1 below.

TABLE 1

| Organic Active Layer | Charge Mobility (cm²/V · s) | On/Off Ratio (−60 V) | On/Off Ratio (−40 V) | Vth (V) |
|---|---|---|---|---|
| Treatment at 100° C. | $1 \times 10^{-5}$ | $5.5 \times 10^1$ | $2.0 \times 10^1$ | −17 |
| Treatment at 200° C. | $1.6 \times 10^{-3}$ | $4.2 \times 10^4$ | $1.2 \times 10^4$ | −22 |

As is apparent from Table 1, the heat treatment of the polythiophene derivative used in the OTFT device of example embodiments of the present invention resulted in increased charge mobility and on/off ratio. Hence, the OTFT device was confirmed to exhibit improved performance.

Example 3

Manufacture of OTFT Using Polythiophene Derivative B

A BC type OTFT device, as shown in FIG. 1, was manufactured in the same manner as in Example 2, with the exception that the polythiophene derivative B synthesized in Synthetic Example 2 was used. The charge mobility of the device was measured. To observe the changes in properties in the device after the UV treatment of the organic polymer semiconductor, the polythiopene derivative was baked at 100° C. for 1 hr, after which ultraviolet light having luminance of 15 mW/cm² in a wavelength ranging from 250 to 350 nm was radiated thereon in a dose of 1000 mJ/cm², followed by measuring the charge mobility of the device. The measured properties of the device (of this example embodiment) are given in Table 2 below.

TABLE 2

| Organic Active Layer | Charge Mobility (cm²/V · s) | On/Off Ratio (−60 V) | On/Off Ratio (−40 V) | Vth (V) |
|---|---|---|---|---|
| Treatment at 100° C. | $2.5 \times 10^{-5}$ | $4.3 \times 10^1$ | $1.7 \times 10^1$ | −18 |
| UV Treatment | $3.3 \times 10^{-3}$ | $6.5 \times 10^4$ | $4.2 \times 10^4$ | −6 |

As is apparent from Table 2, the UV treatment of the polythiophene derivative used in the OTFT device of an example embodiment of the present invention resulted in increased charge mobility and on/off ratio. Hence, the OTFT device of example embodiments was confirmed to exhibit improved performance.

Example 4

Manufacture of OTFT Using Polyquinoxaline Derivative C

A BC type OTFT device, as shown in FIG. 1, was manufactured in the same manner as in Example 2, with the exception that the polyquinoxaline derivative C synthesized in Synthetic Example 3 was used. The charge mobility of the device was measured.

To observe the changes in properties of the device after the heat treatment of the organic polymer semiconductor, the polyquinoxaline derivative was baked at 100° C. for 1 hr, and then heat treated at 200° C. for 1 hr, followed by measuring the charge mobility of the device. The measured properties of the device (of this example embodiment) are given in Table 3 below.

TABLE 3

| Organic Active Layer | Charge Mobility ($cm^2/V \cdot s$) | On/Off Ratio (−60 V) | On/Off Ratio (−40 V) | Vth (V) |
|---|---|---|---|---|
| Treatment at 100° C. | $1.7 \times 10^{-5}$ | $3.2 \times 10^{1}$ | $2.1 \times 10^{1}$ | −15 |
| Treatment at 200° C. | $6.3 \times 10^{-3}$ | $7.3 \times 10^{4}$ | $5.2 \times 10^{4}$ | −4 |

As is apparent from Table 3, the heat treatment of the polyquinoxaline derivative used in the OTFT device of example embodiments of the present invention resulted in increased charge mobility and on/off ratio. Hence, the OTFT device of example embodiments of the present invention was confirmed to exhibit improved performance.

As described hereinbefore, example embodiments of the present invention provide novel organic polymer semiconductor compound(s), a method of forming an organic polymer semiconductor thin film using the same, and an OTFT using the same. According to an example embodiment of the present invention, the organic polymer semiconductor comprises a polymer organic semiconductor compound having a novel structure suitable for spin casting at room temperature. In addition, the removable substituent may be removed from the organic polymer semiconductor compound by heat or light (or radical reaction) treatment. By doing so, one may obtain an OTFT device having an increased charge mobility and/or on/off ratio.

Although example embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of forming an organic polymer semiconductor thin film, comprising:

applying a solution of an organic polymer semiconductor compound of a polythiophene derivative represented by Formulas 3 or 4 below, to form a coating film; and treating the coating film using heat or light or undergoing a radical reaction such that a removable substituent is removed therefrom, wherein the organic polymer semiconductor compound is converted to an insoluble organic polymer semiconductor thin film that is insoluble in a solvent used in the solution of the organic polymer semiconductor compound:

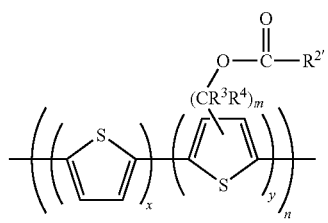

Formula 3

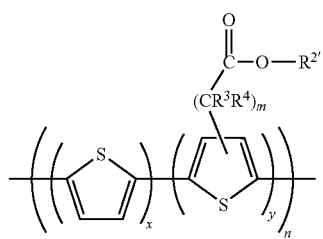

Formula 4 wherein in Formulas 3 and 4, $R^{2'}$ is independently a linear or branched alkyl group having from 1 to 30 carbon atoms; an alkoxyalkyl group having from 1 to 30 carbon atoms; an alkyl group, including a siloxy group, having from 1 to 30 carbon atoms; or a perfluoroalkyl group having from 1 to 30 carbon atoms, wherein $R^3$ and $R^4$ are independently hydrogen; a linear or branched alkyl group having from 1 to 12 carbon atoms; or an alkoxyalkyl group having from 1 to 12 carbon atoms, wherein m is an integer ranging from 1 to 2, wherein $0 \leq x \leq 3$ and y=1, wherein x is an integer, and wherein n is an integer ranging from about 10 to about 1,000.

2. The method as set forth in claim 1, wherein the polythiophene derivative is a member selected from the group consisting of compounds represented by Formulas 5 to 11 below:

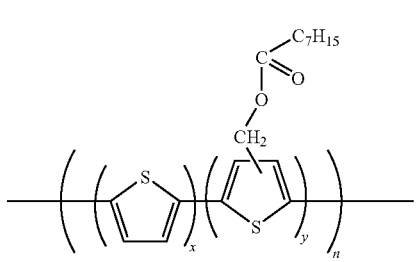

Formula 5 wherein $0 \leq x \leq 3$ and y=1, wherein x is an integer,

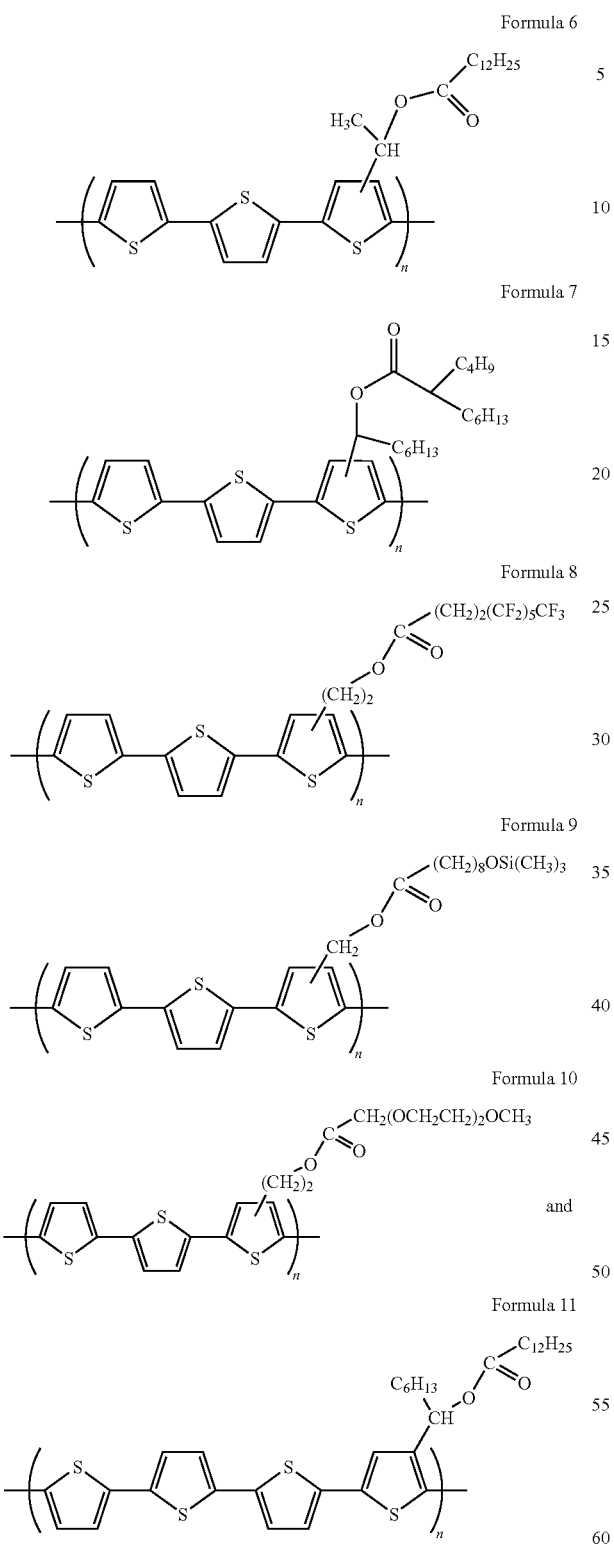

wherein in Formulas 5 to 11, n is an integer ranging from about 10 to about 1,000.

3. The method as set forth in claim 1, wherein the applying of the solution of the organic polymer semiconductor compound is performed through screen printing, printing, spin casting, dipping, or ink-jetting, so that the solution of the organic polymer semiconductor compound is formed into the coating film.

4. The method as set forth in claim 1, wherein treating the coating film includes using the heat at a temperature from about 150° C. to about 300° C.

5. The method as set forth in claim 1, wherein treating the coating film includes using the light by radiating ultraviolet light.

6. The method as set forth in claim 5, wherein treating the coating film includes using the light by radiating ultraviolet light having a wavelength ranging from about 250 nm to about 350 nm in a dose from about 500 Mj/cm$^2$ to about 1000 Mj/cm$^2$.

7. A method of forming an organic polymer semiconductor thin film, comprising:

applying a solution of an organic polymer semiconductor compound of a polythiophene derivative represented by Formula 4 below, to form a coating film; and treating the coating film using heat or light or undergoing a radical reaction such that a removable substituent is removed therefrom, wherein the organic polymer semiconductor compound is converted to an insoluble organic polymer semiconductor thin film that is insoluble in a solvent used in the solution of the organic polymer semiconductor compound:

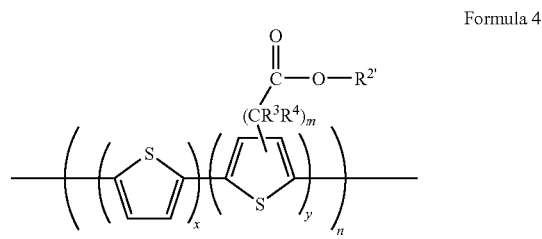

Formula 4 wherein, in Formula 4, R$^{2'}$ is independently a linear or branched alkyl group having from 1 to 30 carbon atoms, an alkoxyalkyl group having from 1 to 30 carbon atoms, an alkyl group, including a siloxy group, having from 1 to 30 carbon atoms, or a perfluoroalkyl group having from 1 to 30 carbon atoms, wherein R$^3$ and R$^4$ are independently hydrogen, a linear or branched alkyl group having from 1 to 12 carbon atoms, or an alkoxyalkyl group having from 1 to 12 carbon atoms, wherein m is an integer ranging from 1 to 2, wherein $0 \leq x \leq 3$ and y is 1, x being an integer, and wherein n is an integer ranging from about 10 to about 1,000.

8. A method of forming an organic polymer semiconductor thin film, comprising:

applying a solution of an organic polymer semiconductor compound of a polymer compound represented by Formula 12 below, to form a coating film; and treating the coating film using heat or light or undergoing a radical reaction such that a removable substituent is removed therefrom, wherein the organic polymer semiconductor compound is converted to an insoluble organic polymer semiconductor thin film that is insoluble in a solvent used in the solution of the organic polymer semiconductor compound:

Formula 12

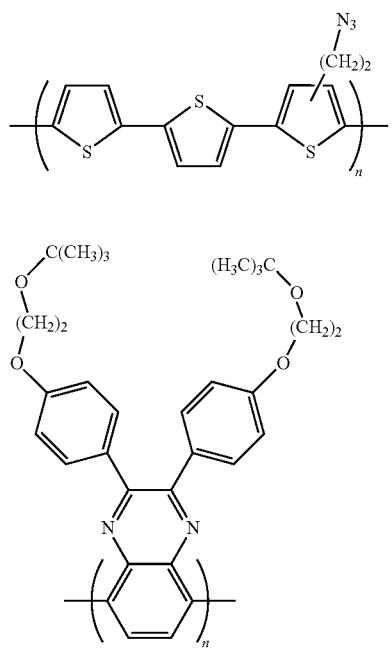

Formula 13 wherein in Formula 12, n is an integer ranging from about 10 to about 1,000.

9. A method of forming an organic polymer semiconductor thin film, comprising:

forming a coating film by applying a solution of an organic polymer semiconductor compound represented by Formula 13 below:

Formula 12

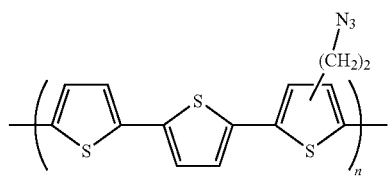

Formula 13

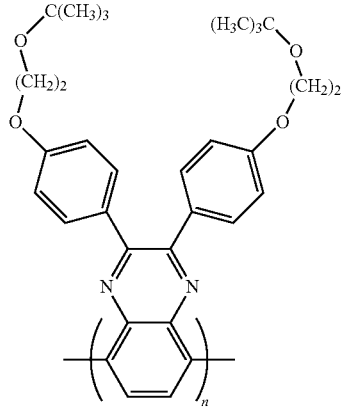

wherein, in Formula 13, n is an integer ranging from about 10 to about 1,000; and treating the coating film using heat or light or undergoing a radical reaction such that a removable substituent is removed therefrom, wherein the organic polymer semiconductor compound is converted to an insoluble organic polymer semiconductor thin film that is insoluble in a solvent used in the solution of the organic polymer semiconductor compound.

* * * * *